United States Patent
Casady et al.

(10) Patent No.: US 6,503,782 B2
(45) Date of Patent: Jan. 7, 2003

(54) COMPLEMENTARY ACCUMULATION-MODE JFET INTEGRATED CIRCUIT TOPOLOGY USING WIDE (>2EV) BANDGAP SEMICONDUCTORS

(75) Inventors: Jeffrey Blaine Casady, Starkville, MS (US); Benjamin Blalock, Starkville, MS (US); Stephen E. Saddow, Starkville, MS (US); Michael S. Mazzola, Starkville, MS (US)

(73) Assignee: Mississippi State University Research and Technology Corporation (RTC), Mississippi State, MS (US)

( * ) Notice: Subject to any disclaimer, the term of this patent is extended or adjusted under 35 U.S.C. 154(b) by 0 days.

(21) Appl. No.: 09/796,490

(22) Filed: Mar. 2, 2001

(65) Prior Publication Data

US 2002/0123174 A1 Sep. 5, 2002

(51) Int. Cl.$^7$ .......................... H01L 21/332; H01L 29/74
(52) U.S. Cl. .......................... 438/135; 438/137; 257/77; 257/163; 257/164; 257/170; 327/427; 327/430; 327/434
(58) Field of Search .................. 257/77, 163, 164, 257/170; 327/427, 430, 434; 438/135, 137

(56) References Cited

U.S. PATENT DOCUMENTS

| | | | |
|---|---|---|---|
| 5,396,085 A | * | 3/1995 | Baliga ............................ 29/10 |
| 5,973,550 A | * | 10/1999 | Bowers et al. ............... 327/541 |
| 6,373,318 B1 | * | 4/2000 | Dohnke et al. ............. 327/427 |
| 6,107,649 A | | 8/2000 | Zhao |
| 6,329,675 B2 | * | 12/2001 | Singh et al. ................... 257/77 |

OTHER PUBLICATIONS

J.B. Casady., W.C. Dillard, R.W. Johnson, and U. Rao, "A Hybrid, 6H–SiC Temperature Sensor Operational from 25° C to 500° C," IEEE Trans. Comp., Pack., and Man. Tech.–A, vol. 19, No. 3, pp. 416–422, Sep. 1996.

W. Xie, J.A. Cooper, Jr., and M.R. Melloch, "Monolithic NMOS Digital Integrated Circuits in 6H–SiC," IEEE Elect. Dev. Lett., vol. 15, No. 11, p. 455–7, Nov. 1994.

W.C. Dillard, J.B. Casady, R.C. Jaeger, D.C. Sheridan, and R.W. Johnson, "High–temperature (350° C) 4H–SiC, thick–film hybrid operational amplifier: design, fabrication, and performance," Trans. 3$^{rd}$ Int'l. High Temp. Elect. Conf. (HiTEC), Albuquerque, NM, Session VIII, pp. 15–20, Jun. 9–14, 1996.

(List continued on next page.)

Primary Examiner—David Nelms
Assistant Examiner—Reneé R Berry
(74) Attorney, Agent, or Firm—Piper Rudnick LLP; Steven B. Kelber (57) ABSTRACT

A method and device produced for design, construction, and use of integrated circuits in wide bandgap semiconductors, including methods for fabrication of n-channel and p-channel junction field effect transistors on a single wafer or die, such that the produced devices may have pinchoff voltages of either positive or negative polarities. A first layer of either p-type or n-type is formed as a base. An alternating, channel layer of either n-type or p-type is then formed, followed by another layer of the same type as the first layer. Etching is used to provide contacts for the gates, source, and drain of the device. In one variation, pinchoff voltage is controlled via dopant level and thickness the channel region. In another variation, pinchoff voltage is controlled by variation of dopant level across the channel layer; and in another variation, pinchoff voltage is controlled by both thickness and variation of dopant level.

20 Claims, 7 Drawing Sheets

OTHER PUBLICATIONS

D.B. Slater, Jr., L.A. Lipkin, G.M. Johnson, A.V. Suvorov, and J.W. Palmour, "NMOS and PMOS High Temperature Enhancement–Mode Devices and Circuits in 6H–SiC," Inst. Phys. Conf. Ser. No. 142, pp. 805–808, IOP Publishing, Ltd., 1996.

M. Tomano, R.W. Johnson, R.C. Jaeger, and W.C. Dillard, "A Hybrid Silicon Carbide Differential Amplifier for 350° C Operation," IEEE Trans. Comp. Hybrids, and Man. Tech., vol. 16, No. 5, p. 536–542, Aug. 1993.

M. Tomano, R.W. Johnson, R.C. Jaeger, and J.W. Palmour, "A SiC Operational Amplifier for 350° C Operation," Proc. of the $42^{nd}$ Elect. Comp. and Tech. Conf., p. 157–161, May 18–20, 1992.

D.M. Brown, M. Ghezzo, J. Kretchmer, V. Krishnamurthy, G. Michon, G. Gati, "High Temperature Silicon Carbide Planar IG Technology and first Monolithic Silicon Carbide Operational Amplifier IC," Trans. $2^{nd}$ Int'l. High Temp. Elect. Conf. (HiTEC), Charlotte, N.C., Session XI, p. 17–22, Jun. 5–10, 1994.

\* cited by examiner

COMPLEMENTARY ACCUMULATION-MODE JFET INTEGRATED CIRCUIT TOPOLOGY USING WIDE (>2EV) BANDGAP SEMICONDUCTORS

BACKGROUND OF THE INVENTION

1. Field of the Invention

The present invention relates to a method and system for fabricating integrated circuits, and in particular to a method and system for fabricating n-channel and p-channel junction field effect transistor circuits on a single wafer or die having pinchoff voltages of both positive and negative polarities.

2. Background of the Technology

The prior art for fabrication of silicon carbide (SiC) integrated circuits has consisted of two approaches to date, namely hybrid and monolithic. The hybrid approach includes mounting SiC metal-semiconductor field effect transistors (MESFETs) or junction field effect transistors (JFETs) onto a ceramic substrate, and wirebonding the bare die to traces that connect the other discrete components (e.g., resistors) to form the circuit. The advantage of this approach is that devices can be preselected for maximum performance, but assembly costs are high, and total circuit dimensions are large in comparison to the monolithic approach.

The existing monolithic approach in wide bandgap circuit design consists of standard complementary metal-oxide semiconductor (CMOS) circuit design using complementary logic via p-channel and n-channel metal-oxide-semiconductor field-effect-transistors (MOSFETs) integrated into the same chip. Complementary logic means that the gate bias needed to turn the devices on can be of either polarity. In silicon, CMOS is preferred for logic circuits owing to its low static power dissipation (due in part to its superior input impedance), and ease of logic circuit design, which is facilitated by the complementary performance that can be achieved between p-channel and n-channel devices. However, this approach, which is heavily used in silicon, ignores some basic problems with SiC and other wide bandgap systems. First, because of the wide bandgap, the barrier to leakage (via Fowler-Nordheim tunneling) currents through the oxide on SiC is dramatically reduced. This is especially true at higher temperatures, where SiC is projected for significant usage. Second, the reliability of the MOS system in silicon and SiC is suspect under extreme temperature and high radiation environments, which are both applications of great interest for SiC devices.

Third, the input impedance of a SiC JFET is significantly greater than that of a silicon JFET because of the difference in bandgap. Also, the JFET structure is more resistant than the MOSFET to damage or destruction as a result of electrostatic discharge or spikes in the input voltage signal. Finally, it is possible to fabricate complementary logic structures using SiC JFETs by varying the pinchoff voltage from negative to positive via channel thickness control. Although this is also possible in silicon JFETs, it is much more difficult to accomplish, and the voltage swing on the input of the device is much more restricted because the built-in potential of a silicon pn junction is a fraction of that in SiC. Exceeding the built-in potential of the gate-to-source pn junction will forward bias the junction and lead to excessive input leakage current through the gate terminal. This leakage current will dramatically degrade the device performance.

SUMMARY OF THE INVENTION

In order to overcome the problems with the prior art fabrication of SiC integrated circuits, as well as others, the present invention comprises a method and device produced for design, construction, and use of integrated circuits in wide bandgap semiconductors, including methods for fabrication of n-channel and p-channel JFETs on a single wafer or die, such that the produced devices are capable of having pinchoff voltages of either positive or negative polarities, including both types within the same circuit. In an embodiment of the present invention, a first layer of either p-type or n-type is formed as a base. An alternating channel layer of either n-type or p-type is then formed, followed by another layer of the same type as the first layer. Etching is used to provide contacts for the gates, source, and drain of the device. In one embodiment, pinchoff voltage is controlled via dopant level and thickness of the channel region. In another embodiment fabrication of devices occurs using a constant channel thickness, but with varied channel doping selectively across the wafer via implantation or selective epitaxial regrowth. In yet another embodiment of the present invention, both the doping and channel thickness of various devices in the circuit are selectively varied.

To achieve the stated and other advantages of the present invention, as embodied and described below, the invention includes a method for making integrated circuits having at least two junction field effect transistors, each of the at least two junction field effect transistors comprising a first layer, a second layer, and a third layer, each of the layers comprising a wide bandgap semiconductor material, the method comprising: providing a first heavily doped layer, the first heavily doped layer having a surface, and wherein the first heavily doped layer is a first type; forming a second layer on the surface of the first heavily doped layer, wherein the second layer has a thickness and a surface, and wherein the second layer is a second type; reducing the thickness of the second layer to predetermined thickness; and forming a third heavily doped layer of the first type on the surface of the second layer; wherein the predetermined thickness of the second layer for at least a first one of the at least two junction field effect transistors differs from the predetermined thickness of the second layer for at least a second one of the at least two junction field effect transistors.

To achieve the stated and other advantages of the present invention, as embodied and described below, the invention further includes a method for making integrated circuits having at least two junction field effect transistors, each of the at least two junction field effect transistors comprising a first layer, a second layer, and a third layer, each of the layers comprising a wide bandgap semiconductor material, the method comprising: providing a first heavily doped layer, the first heavily doped layer having a first layer surface, and wherein the first heavily doped layer is a first type; forming a second layer on the surface of the first heavily doped layer, wherein the second layer has a thickness, a surface, a breadth, and a doping, wherein the doping of the second layer varies across the breadth of the second layer, and wherein the second layer is a second type; reducing the thickness of the second type layer to predetermined thickness; and forming a third heavily doped layer of the first type on the surface of the second layer; wherein the doping of the second layer for at least a first one of the at least two junction field effect transistors differs from the doping of the second layer for at least a second one of the at least two junction field effect transistors.

To achieve the stated and other advantages of the present invention, as embodied and described below, the invention further includes a method for making an integrated circuit from layers using a wide bandgap semiconductor material, the circuit including at least two junction field effect transistors, comprising: providing a first heavily doped layer, the first heavily doped layer having a surface, wherein the first heavily doped layer comprises one selected from a group consisting of a p-type layer and an n-type layer, such that the first heavily doped layer has a first type; forming a second layer on the surface of the first heavily doped layer, wherein the second type layer has a surface and a thickness; wherein the second type differs from the first type; and wherein the second type is selected from a group consisting of a p-type layer and an n-type layer; variably reducing the second layer, such that the second layer has a varied thickness; and forming a third heavily doped layer of the first type on the surface of the second type layer, such that a first junction field effect transistor having a first second layer thickness and a second junction field effect transistor having a second second layer thickness are formed; wherein the first junction field effect transistor has a first pinchoff voltage and the second junction field effect transistor has a second pinchoff voltage, the first pinchoff voltage and the second pinchoff voltage differing with the first second layer thickness and the second second layer thickness.

To achieve the stated and other advantages of the present invention, as embodied and described below, the invention further includes an integrated circuit having at least two junction field effect transistors, each of the at least two junction field effect transistors having a first layer, a second layer, and a third layer, the circuit comprising: a first heavily doped layer, the first heavily doped layer having a surface, and wherein the first layer is a first type; a second layer formed on the surface of the first heavily doped layer, wherein the second layer has a varying thickness and a surface, and wherein the second layer is a second type; and a third heavily doped layer of the first type formed on the surface of the second layer; wherein the varying thickness of the second layer includes a first thickness and a second thickness; wherein the at least two junction field effect transistors include a first junction field transistor and a second junction field effect transistor; wherein the first junction field effect transistor has a second layer of the first thickness and wherein the second junction field effect transistor has a second layer of the second thickness.

To achieve the stated and other advantages of the present invention, as embodied and described below, the invention further includes an integrated circuit having at least two junction field effect transistors, each of the at least two junction field effect transistors having a first layer, a second layer, and a third layer, the circuit comprising: a first heavily doped layer, the first heavily doped layer having a surface, and wherein the first layer is a first type; a second layer formed on the surface of the first heavily doped layer, wherein the second layer has a surface, a breadth, and a doping varying over the breadth, and wherein the second layer is a second type; and a third heavily doped layer of the first type formed on the surface of the second layer; wherein the varying doping of the second layer includes a first doping and a second doping; wherein the at least two junction field effect transistors include a first junction field effect transistor and a second junction field effect transistor; wherein the first junction field effect transistor has a first doping and wherein the second junction field effect transistor has a second doping.

Additional advantages and novel features of the invention will be set forth in part in the description that follows, and in part will become more apparent to those skilled in the art upon examination of the following or upon learning by practice of the invention.

DETAILED DESCRIPTION

The present invention comprises a method and devices produced for design, construction, and use of integrated circuits in wide bandgap semiconductors, including methods for fabrication of n-channel and p-channel JFETs on a single wafer or die, such that the produced devices are capable of having pinchoff voltages of either positive or negative polarities, including both types within the same circuit.

Figure 1:
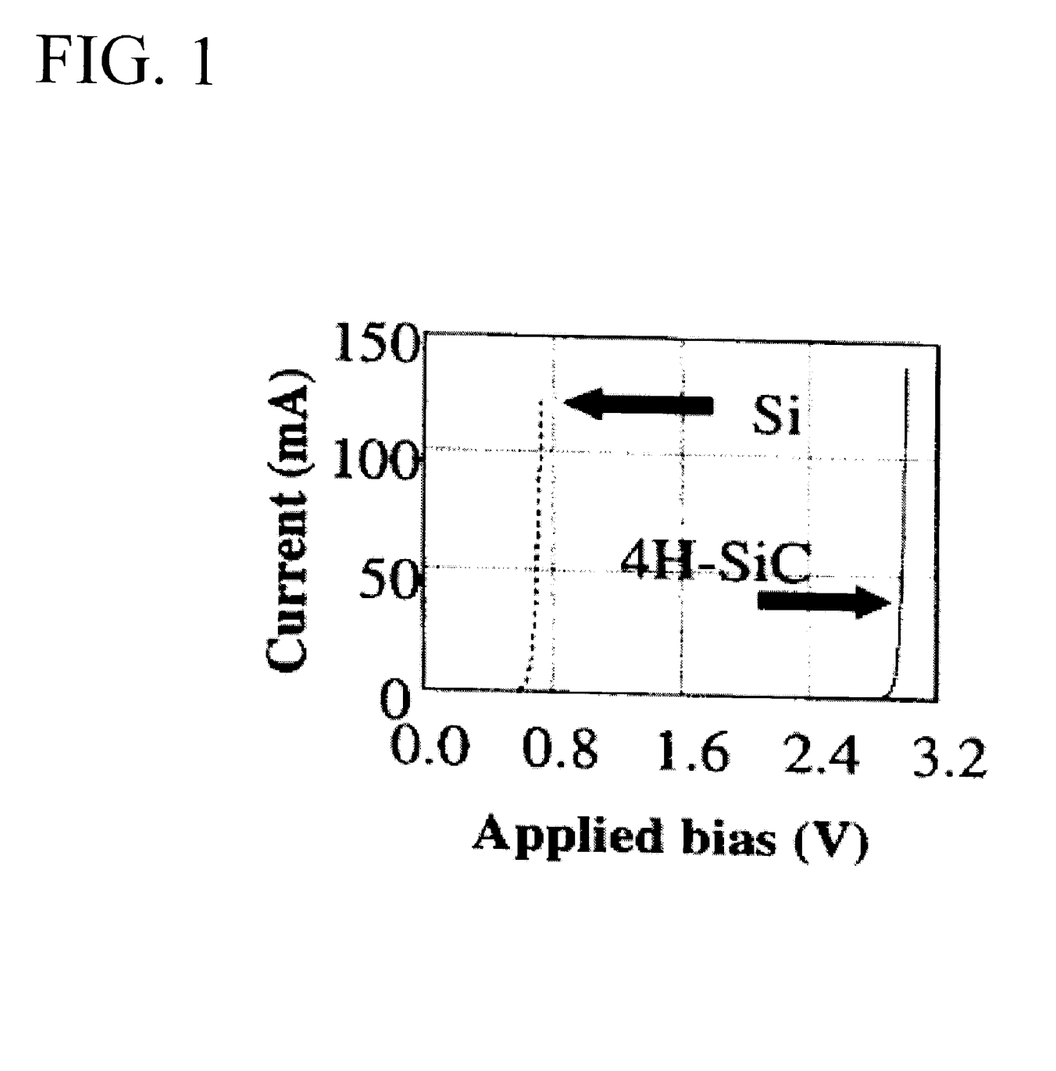
FIG. 1 is a graphical comparison of turn-on voltage for Si and 4H—SiC for applications in accordance with an embodiment of the present invention.

Using wide bandgap semiconductors, many limitations of prior art use of silicon pn junctions are overcome in SiC, including the problem of the built-in potential of the gate-to-source pn junction being forward biased, leading to excessive input leakage current through the gate terminal. For example, as shown in FIG. 1, the turn-on voltage of a pn junction of a 4H—SiC diode (–2.7 V) is compared to a silicon diode (–0.7 V), illustrating nearly a four-fold increase. Thus, for an n-channel 4H—SiC JFET, in accordance with an embodiment of the present invention, it is possible to increase the threshold voltage of the device to reasonable levels for both manufacturing and circuit design.

Figure 2:
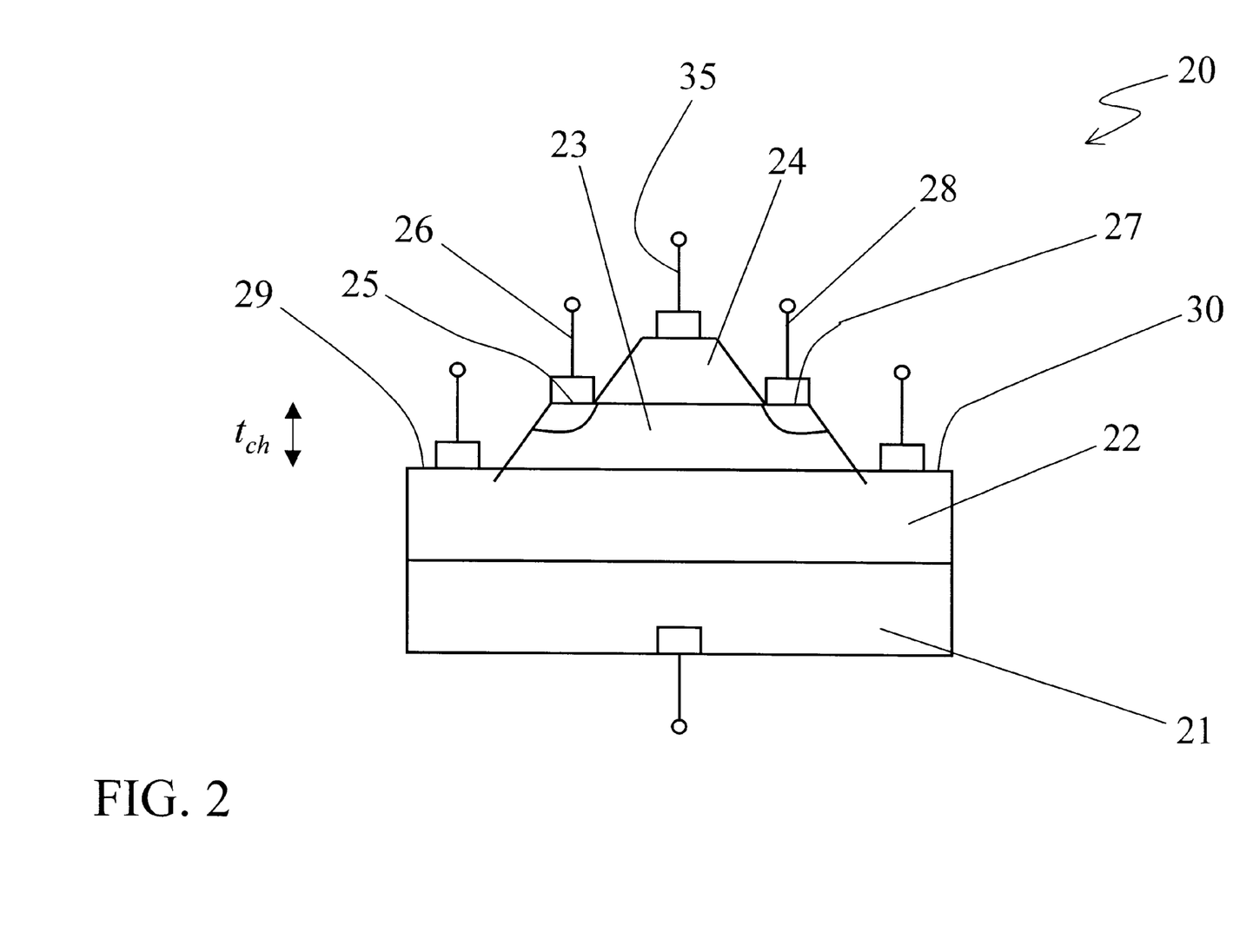
FIG. 2 presents a cross-sectional view of an example junction field effect transistor (JFET) produced in accordance with an embodiment of the present invention.

An example device produced in accordance with one embodiment of the present invention is shown in FIG. 2. FIG. 2 presents an n-channel JFET 20 with dual gate control. The structure 20 (shown for n-type in FIG. 2) is fabricated on an n-type or semi-insulating substrate 21 using a heavily doped p-type layer 22 as the bottom gate control. This is followed by formation of the n-type channel region 23, which is grown carefully to a specified channel thickness $t_{ch}$ and dopant level to ensure proper device performance and to maintain a pre-determined pinchoff voltage. Next, selective reactive ion etching is performed to set the channel thickness $t_{ch}$ for various devices on the wafer as needed, resulting in the varied thickness of the channel $t_{ch}$ for devices across the wafer.

Finally, another heavily doped p-type layer 24 is grown on top of the channel region 23 to form the top gate layer 24. More etching is used to define the source contact area 25 for source contact 26, the drain contact area 27 for drain contact 28, and the bottom gate contact areas 29, 30 for the gate contacts 31, 32, respectively. Gate contact 35 is added via top gate layer 24, and the devices 20 are isolated via etching or implantation if more than one device 20 are created on the same wafer.

Figure 3:
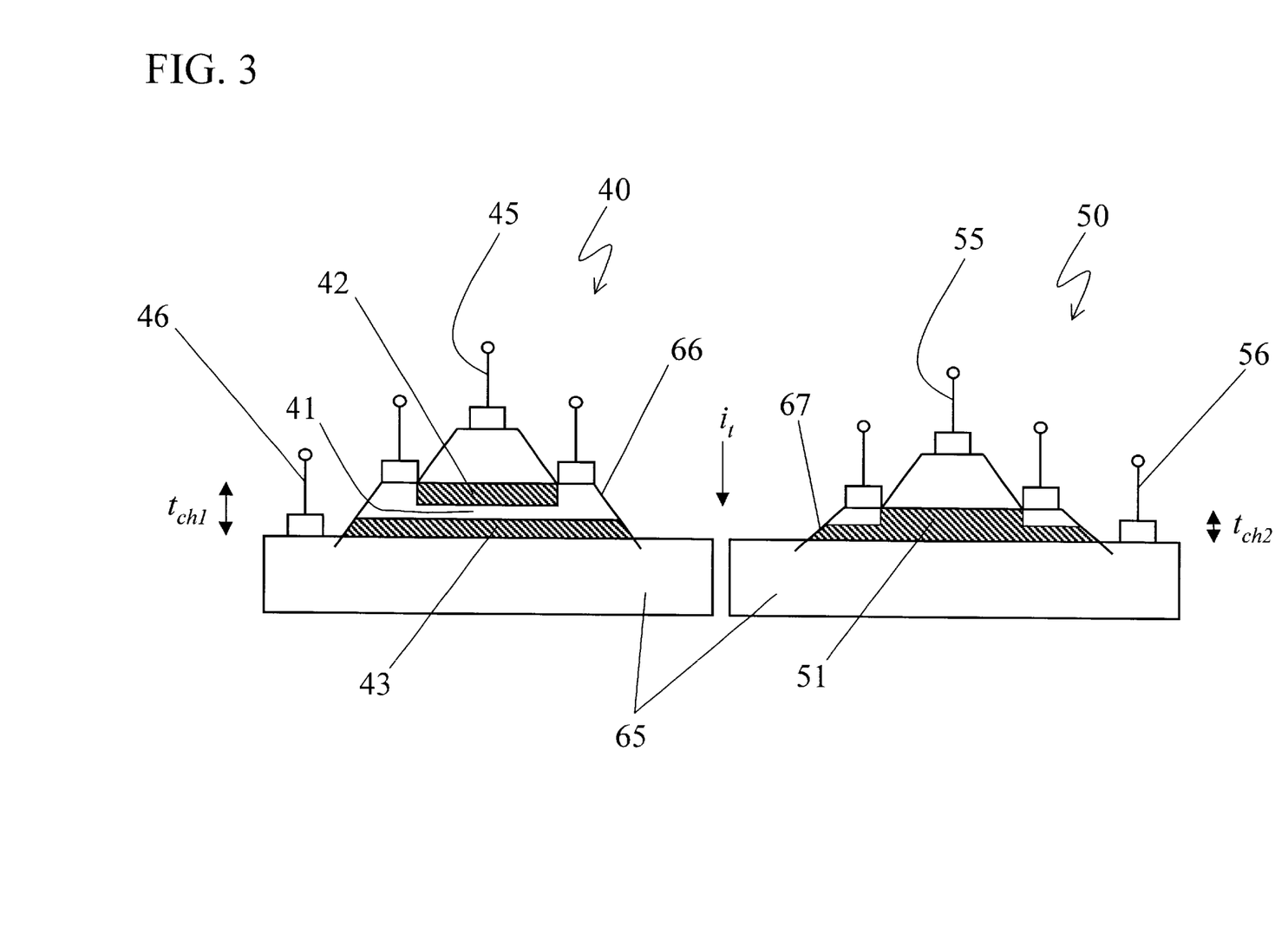
FIG. 3 shows a cross-sectional view of a normally on and a normally off JFET produced in accordance with an embodiment of the present invention.

The resulting cross-section for multiple devices for one embodiment of the present invention is realized in the second cross-section shown in FIG. 3, which illustrates two, n-channel JFETs 40, 50 formed on one or more bottom gate control layers 65. The two JFETs 40, 50 have different channel thickness ($t_{ch1}$ and $t_{ch2}$) for the second layer regions 66, 67, and thus have different pinchoff voltages. The JFET on the left 40, as viewed in FIG. 3, has a negative pinchoff voltage, since the thicker channel region $t_{ch1}$ is not pinched off (e.g., current flow channel 41 exists between depletion regions 42, 43 formed between gates 45, 46) without significant reverse bias applied. The JFET on the right 50, as viewed in FIG. 3, has a positive pinchoff or threshold voltage, since at zero bias, the depletion region 51 of the two gates pinches off the thinner channel $t_{ch2}$. The two JFETs 40, 50 are separated by, for example, an isolation trench $i_t$, formed by etching or otherwise during making of the JFETs 40, 50.

Figure 4:
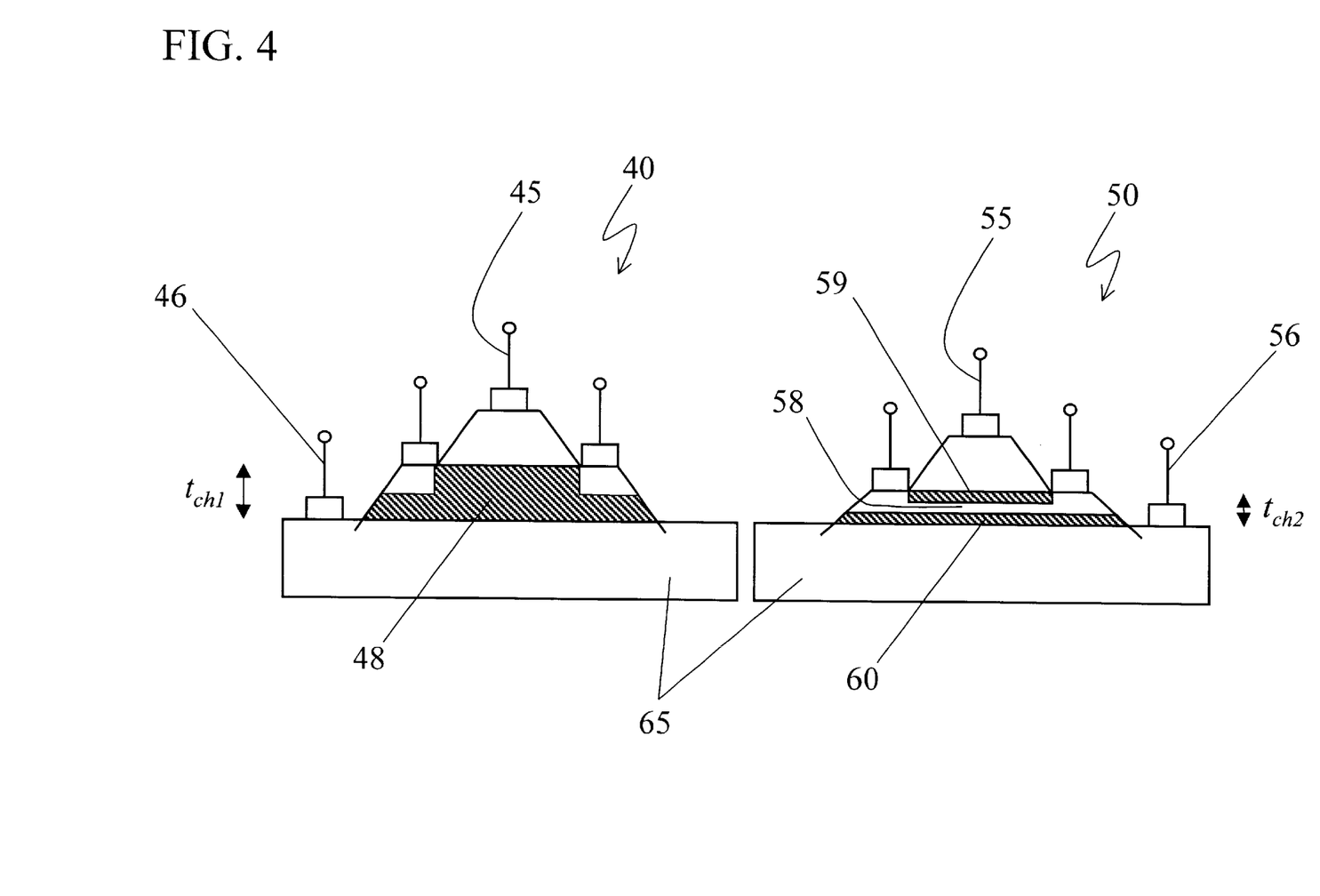
FIG. 4 presents the JFETs of FIG. 3 with voltages applied, such that the normally on JFET is pinched off and the normally off JFET allows current to flow.

In the JFET on the right 50, as viewed in FIG. 3, only when applying a positive bias via gates 55, 56 is the depletion region thickness able to reduce enough to allow current flow, as shown in FIG. 4. As shown in FIG. 4, upon application of the positive bias via gates 55, 56, a channel 58 forms, separating depletion areas 59, 60 and allowing current flow between source 62 and drain 63. Again, because of the wide bandgap, a significant forward bias (up to 2.5 V) can be applied while still maintaining the high input impedance of each device.

For the JFET on the left 40, as viewed in FIG. 3, upon applying a positive bias via gates 45, 46, the channel 41 is pinched off, having depletion region 48, as shown in FIG. 4.

In forming the layers for the embodiment shown in FIGS. 3 and 4, the first layer 65 is first formed. In one embodiment, the first layer 65 is formed on a substrate. A second layer is then formed, the second layer including second layer regions 66, 67, the second layer initially having a single thickness over its breadth, as viewed from left to right in FIGS. 3 and 4. Etching is then selectively applied to to the second layer, such that the second layer region to the left 66, as viewed in FIGS. 3 and 4 is of a greater thickness $t_{ch}$, than the thickness $t_{ch2}$ of the second layer region to the right 82, as viewed in FIGS. 5 and 6. Separation between the layer portions of the two transistors 40, 50, as well as contact regions, are produced by, for example, etching. A layer is formed on the surfaces of the second layer regions, with additional etching as necessary to provide contact regions.

Figure 5:
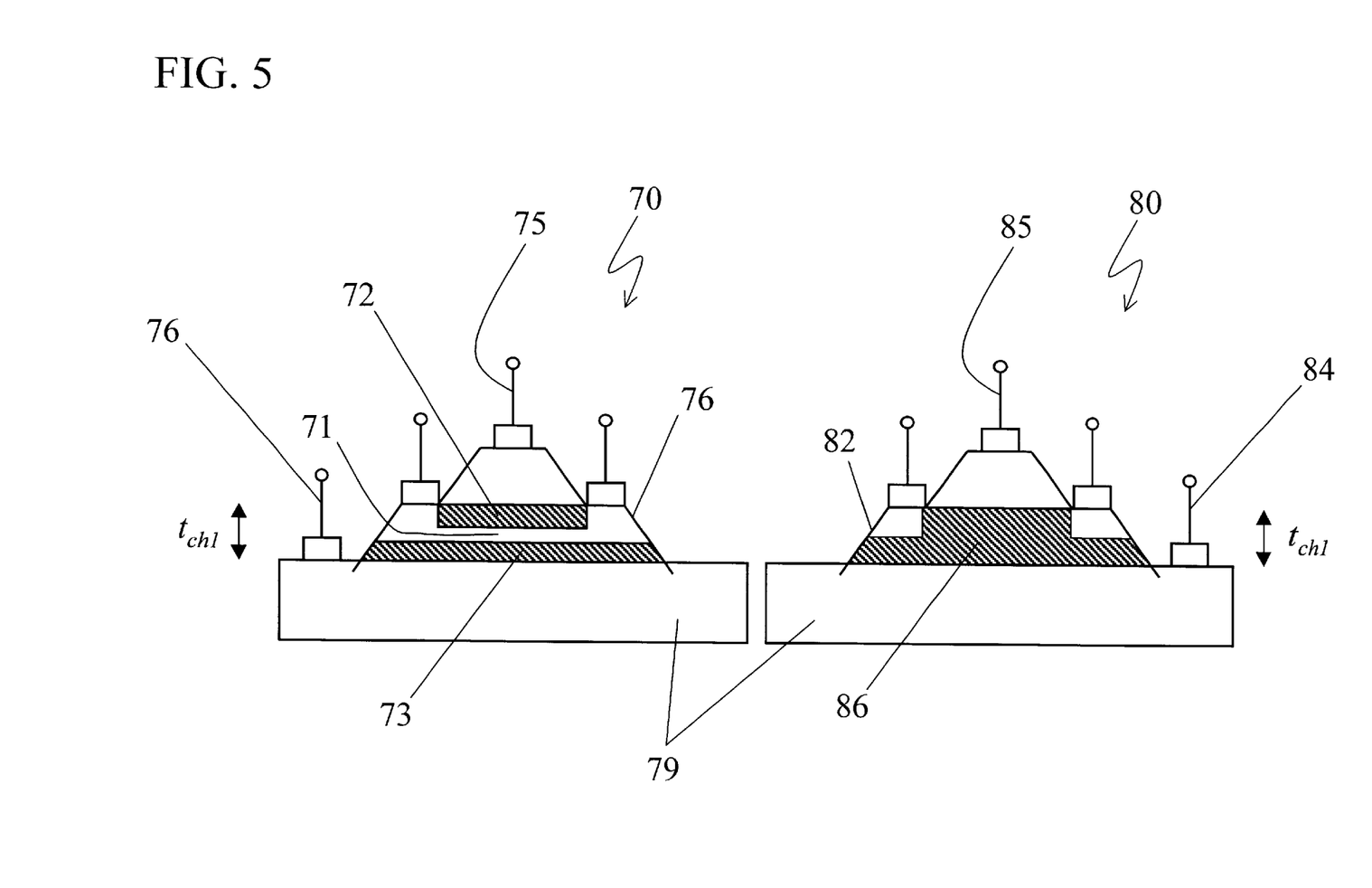
FIG. 5 is a cross-sectional view of a normally on and a normally off JFET produced in accordance with another embodiment of the present invention.
Figure 6:
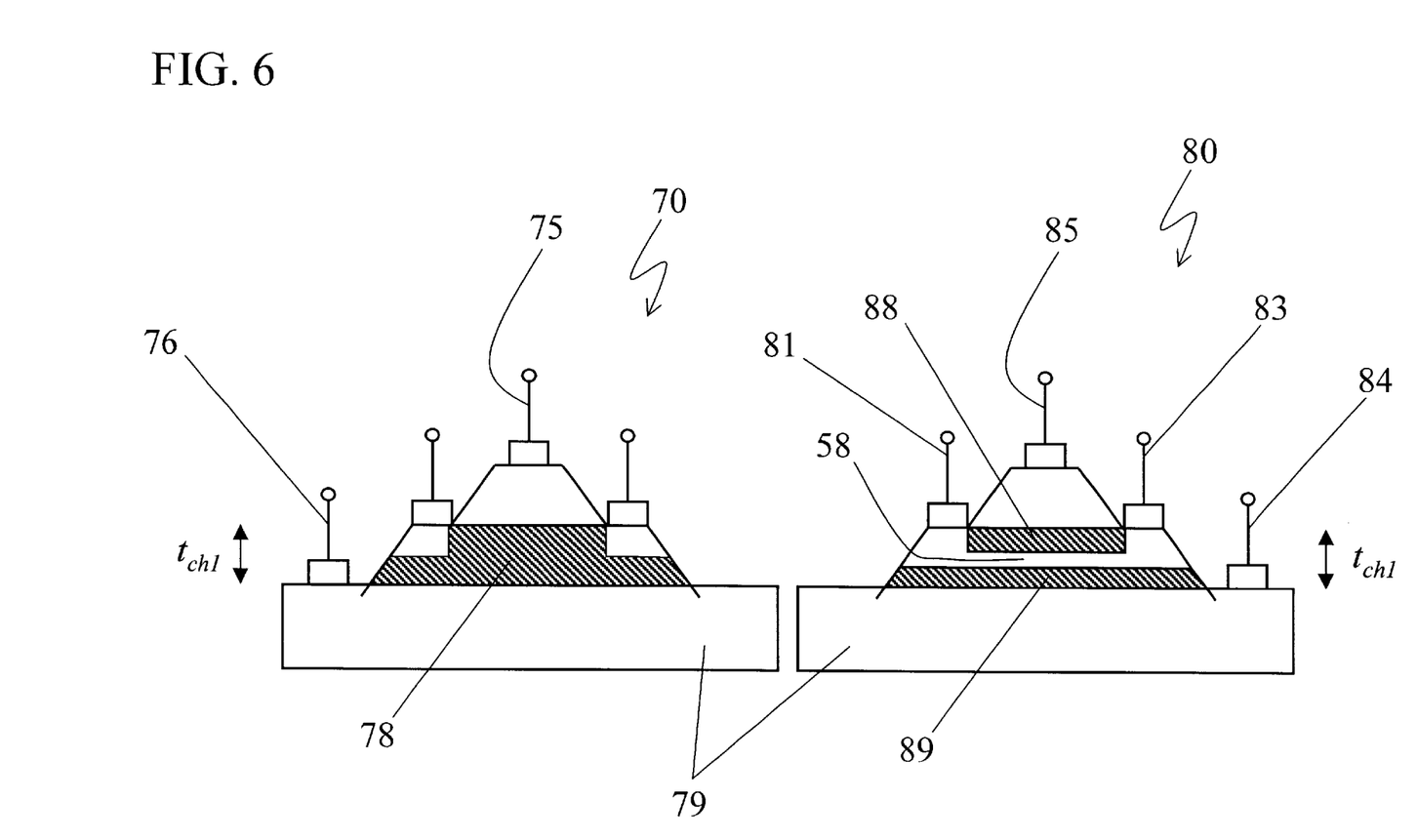
FIG. 6 presents the JFETs of FIG. 5 with voltages applied, such that the normally on JFET is pinched off and the normally off JFET allows current to flow.

FIGS. 5 and 6 present another embodiment of multiple JFET formation. In this embodiment, two n-channel JFETs 70, 80 are formed on one or more bottom control layers 79. The two JFETs have the same channel thickness $t_{ch3}$ for second layer regions 76, 82. The JFET on the left 70, as viewed in FIG. 5 has a negative pinchoff voltage and the JFET on the right 80, as viewed in FIG. 5, has a positive pinchoff voltage. The difference in pinchoff voltage in this embodiment is due to differences in the doping level of the second layers 76, 82. In FIG. 6, the JFET on the right 80, as viewed in FIG. 6, only when applying a positive bias via gates 85, 86 is the depletion region thickness able to reduce enough to allow current flow, as shown in FIG. 6. As shown in FIG. 6, upon application of the positive bias via gates 84, 85, a channel 87 forms, separating depletion areas 88, 89 and allowing current flow between source 81 and drain 83. For the JFET on the left 70, as viewed in FIG. 6, upon applying a positive bias via gates 75, 76, the channel 71 is pinched off, having depletion region 78, as shown in FIG. 6.

In forming the layers for the embodiment shown in FIGS. 5 and 6, the first layer 79 is first formed. In one embodiment, the first layer 79 is formed on a substrate. A second layer is then formed, the second layer including second layer regions 76, 82, the second layer varying in doping over its breadth, such that the doping of the second layer region to the left 76, as viewed in FIGS. 5 and 6 is of a different doping than that of the second layer region to the right 82, as viewed in FIGS. 5 and 6. Separation between the layer portions of the two transistors 70, 80, as well as contact regions, are then produced by, for example, etching. A layer is then formed on the surfaces of the second layer regions 76, 82, and additional etching is used to provide contact areas.

Figure 7:
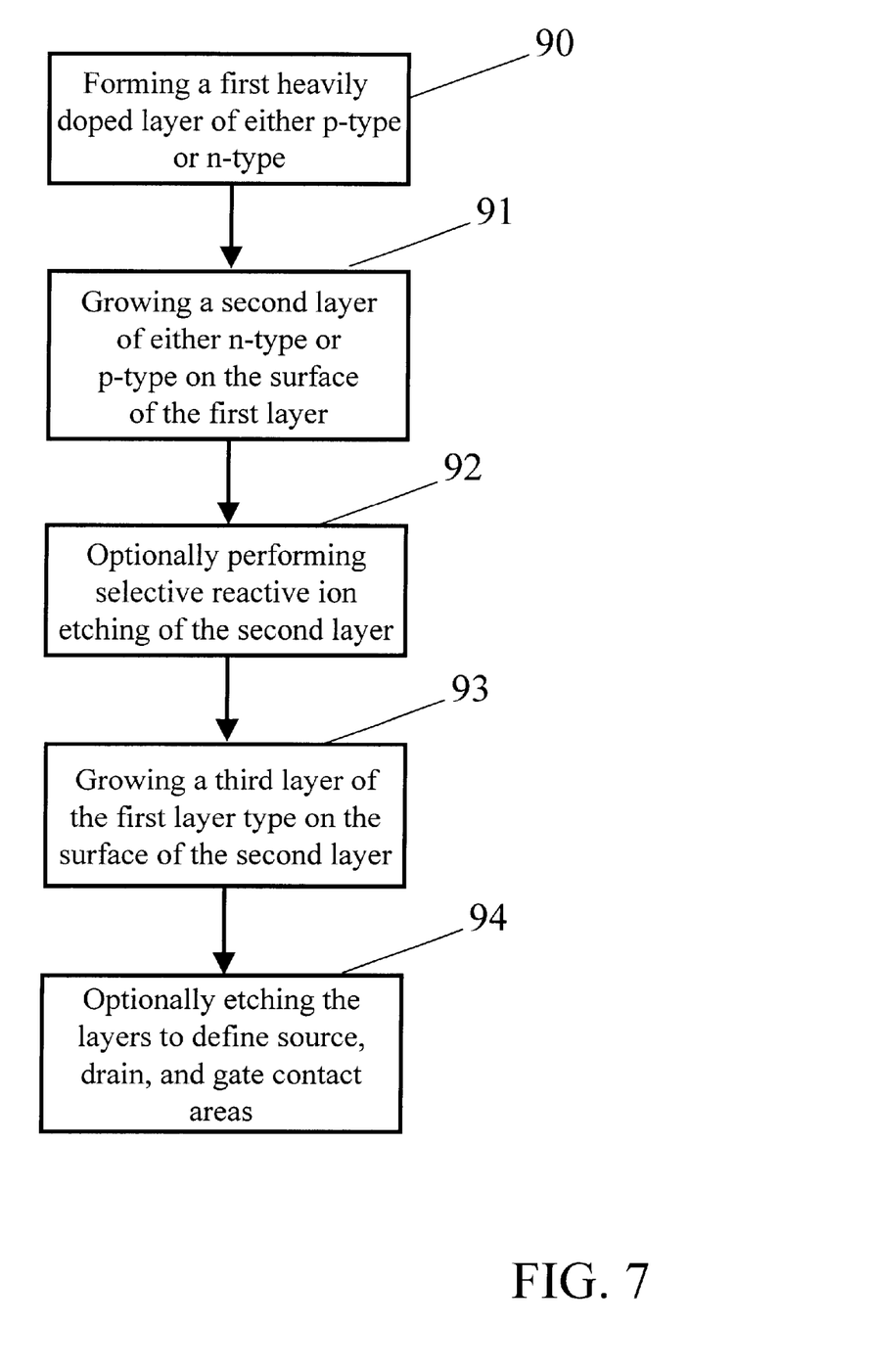
FIG. 7 is a flow diagram of JFET production in accordance with an embodiment of the present invention.

FIG. 7 is a flow diagram for JFET formation in accordance with an embodiment of the present invention. As shown in FIG. 5, JFET formation begins with formation of a first heavily doped layer on a substrate 90, the heavily doped layer being, for example, either a p-type layer or an n-type layer. A second layer of the opposite type, such as an n-type layer upon the first p-type layer or a p-type layer on the first n-type layer, is then grown upon the surface of the first layer 91. Optionally, etching, such as reactive ion etching, or other fine alteration of the thickness of the first second layer is then performed so as to vary the thickness of the channel in the second layer 92, such that the pinchoff voltage and the type of JFET desired is formed. Alternatively, the second layer is formed having varying channel doping. Yet another alternative includes both varying the thickness of the channel and using varying channel doping.

A third layer is then grown on the surface of the second layer 93, the third layer being of the same type as the first layer for JFET formation. Optionally, etching or other selective removal of the layers is then performed so as to define, for example, source, drain, and gate contact areas 94.

Example embodiments of the present invention have now been described in accordance with the above advantages. It will be appreciated that these examples are merely illustrative of the invention. Many variations and modifications will be apparent to those skilled in the art.

What is claimed is:

1. A method for making integrated circuits having at least two junction field effect transistors, each of the at least two junction field effect transistors comprising a first layer, a second layer, and a third layer, each of the layers comprising a wide bandgap semiconductor material, the method comprising:

forming a second layer on a surface of a first heavily doped layer, wherein the first heavily doped layer is a first type, wherein the second layer has a thickness and a surface, and wherein the second layer is a second type;

reducing the thickness of the second layer to a selected thickness, wherein the selected thickness is selected so as to provide selected junction field effect transistor performance characteristics; and forming a third heavily doped layer of the first type on the surface of the second layer;

wherein the selected thickness of the second layer for at least a first one of the at least two junction field effect transistors differs from the selected thickness of the second layer for at least a second one of the at least two junction field effect transistors.

2. The method of claim 1, wherein the first type is a p-type layer and wherein the second type is an n-type layer.

3. The method of claim 1, wherein the first type is an n-type layer and wherein the first type is a p-type layer.

4. The method of claim 1, wherein the at least a first one of the at least two junction field effect transistors has a negative pinchoff voltage.

5. The method of claim 4, wherein the at least a second one of the at least two junction field effect transistors has a positive pinchoff voltage.

6. The method of claim 1, further comprising:
isolating the at least a first one of the at least two junction field effect transistors from the at least a second one of the at least two junction field effect transistors.

7. The method of claim 6, wherein the at least a first one of the at least two junction field effect transistors is isolated from the at least a second one of the at least two junction field effect transistors by etching.

8. The method of claim 6, wherein the at least a first one of the at least two junction field effect transistors is isolated from the at least a second one of the at least two junction field effect transistors by implantation.

9. The method of claim 1, further comprising:
etching the first heavily doped layer to define a source contact area.

10. The method of claim 9, further comprising:
etching the fist heavily doped layer to define a drain contact area.

11. The method of claim 10, further comprising:
etching the second layer to define a first gate contact area.

12. The method of claim 11, further comprising:
providing a second gate contact area for the third layer.

13. The method of claim 1, wherein the second layer includes at least one depletion region and a current channel, wherein each of the at least one depletion region has a thickness, and wherein the current channel is defined by the thickness of the second layer and the thickness of each of the at least one depletion region.

14. The method of claim 13, wherein the second layer is doped by a selected level of doping, and wherein the thickness of each of the at least one depletion region varies depending on the selected level of doping of the second layer.

15. The method of claim 14, wherein the second layer has a breadth, and wherein the selected level of doping varies across the breadth of the second layer.

16. The method of claim 1, wherein each of the at least two junction field effect transistors has a turn-on voltage.

17. The method of claim 16, wherein the turn-on voltage is about 2.7 Volts.

18. The method of claim 1, wherein the wide bandgap semiconductor material comprises silicon carbide.

19. A method for making integrated circuits having at least two junction field effect transistors, each of the at least two junction field effect transistors comprising a first layer, a second layer, and a third layer, each of the layers comprising a wide bandgap semiconductor material, the method comprising:

forming a second layer on a surface of a first heavily doped layer; wherein the first heavily doped layer is a first type; wherein the second layer has a thickness, a surface, a breadth, and a doping; wherein the doping of the second layer varies across the breadth of the second layer; and wherein the second layer is a second type;

reducing the thickness of the second type layer to a selected thickness, wherein the selected thickness is selected so as to provide selected junction field effect transistor performance characteristics; and forming a third heavily doped layer of the first type on the surface of the second layer;

wherein the doping of the second layer for at least a first one of the at least two junction field effect transistors differs from the doping of the second layer for at least a second one of the least two junction field effect transistors.

20. A method for making an integrated circuit from layers using a wide bandgap semiconductor material, the circuit including at least two junction field effect transistors, comprising:

forming a second layer on a surface of a first heavily doped layer; wherein the first heavily doped layer comprises one selected from a group consisting of a p-type layer and an n-type layer, such that the first heavily doped layer has a first type; wherein the second type layer has a surface and a thickness; wherein the second type differs from the first type; and wherein the second type is selected from a group consisting of a p-type layer and an n-type layer;

variably reducing the second layer, such that the second layer has a varied thickness; and forming a third heavily doped layer of the first type on the surface of the second type layer, such that a first junction field effect transistor having a first second layer thickness and a second junction field effect transistor having a second second layer thickness are formed;

wherein the first junction field effect transistor has a first pinchoff voltage and the second junction field effect transistor has a second pinchoff voltage, the first pinchoff voltage and the second pinchoff voltage differing with the first second layer thickness and the second second layer thickness.

* * * * *

UNITED STATES PATENT AND TRADEMARK OFFICE
CERTIFICATE OF CORRECTION

PATENT NO.    : 6,503,782 B2                                      Page 1 of 1
DATED         : January 7, 2003
INVENTOR(S)   : Jeffrey Blaine Casady et al.

It is certified that error appears in the above-identified patent and that said Letters Patent is hereby corrected as shown below:

<u>Title page,</u>
Before the "References Cited" section, please insert the following:

-- This invention was made with U.S. Government support under Contract Number F33615-00-C-2010 awarded by the U.S. Air Force. The U.S. Government may have certain rights in this invention. --

Signed and Sealed this

Seventeenth Day of June, 2003

JAMES E. ROGAN
*Director of the United States Patent and Trademark Office*